United States Patent [19]
Weitzel et al.

[11] Patent Number: 5,885,860
[45] Date of Patent: Mar. 23, 1999

[54] SILICON CARBIDE TRANSISTOR AND METHOD

[75] Inventors: Charles E. Weitzel, Mesa; Karen E. Moore, Phoenix; Kenneth L. Davis, Tempe, all of Ariz.

[73] Assignee: Motorola, Inc., Schaumburg, Ill.

[21] Appl. No.: 874,433

[22] Filed: Jun. 16, 1997

Related U.S. Application Data

[62] Division of Ser. No. 497,569, Jun. 30, 1995.

[51] Int. Cl.⁶ .................................................. H01L 21/338
[52] U.S. Cl. ........................... 438/179; 438/182; 438/931
[58] Field of Search ................................. 438/182, 179, 438/931; 257/77

[56] References Cited

U.S. PATENT DOCUMENTS 5,270,554  12/1993  Palmour ..................................... 257/77

*Primary Examiner*—Brian Dutton
*Attorney, Agent, or Firm*—Robert F. Hightower; Eugene A. Parsons

[57] ABSTRACT

A silicon carbide MESFET (10) is formed to have a source (21) and a drain (22) that are self-aligned to a gate (16) of the MESFET (10). The gate (16) is formed to have a T-shaped structure with a gate-to-source spacer (18) and gate-to-drain spacer (19) along each side of a base of the gate (16). The gate (16) is used as a mask for implanting dopants to form the source (21) and drain (22). A laser annealing is performed after the implantation to activate the dopants. Because the laser annealing is a low temperature operation, the gate (16) is not detrimentally affected during the annealing.

18 Claims, 3 Drawing Sheets

5,885,860

SILICON CARBIDE TRANSISTOR AND METHOD

This is a division of application Ser. No. 08/497 569, filed Jun. 30, 1995.

BACKGROUND OF THE INVENTION

The present invention relates, in general, to semiconductor devices and more particularly, to silicon carbide semiconductor devices.

The semiconductor industry has utilized a variety of processes and structures to form metal semiconductor field effect transistors (MESFETs) from silicon carbide. One problem with these prior transistors is the inability to form structures having a gate that is self-aligned to source and drain areas of the transistor. Activation of dopants within silicon carbide usually requires heating the silicon carbide and the dopants to temperatures in excess of 1200° C. Such high temperatures are detrimental to the materials typically utilized to form the gate of the MESFET. The high temperatures result in destroying the junction formed at the interface of the gate material and the channel, and can also result in significantly deforming the shape of the gate.

Consequently, prior silicon carbide MESFETs generally form source and drain implants, and activate the implants prior to depositing the gate. As a result, the gate is not self-aligned to the source and drain areas. Consequently, the gate to source spacing is larger than that which can be obtained from a self-aligned transistor, and the resulting transconductance and frequency response is less than that which can be obtained from a self-aligned transistor.

Accordingly, it is desirable to have a silicon carbide MESFET having a gate that is self-aligned to the source, that is self-aligned to the drain, and that has a gate-to-source spacing of less than 0.5 microns.

DETAILED DESCRIPTION OF THE DRAWINGS

Figure 1:
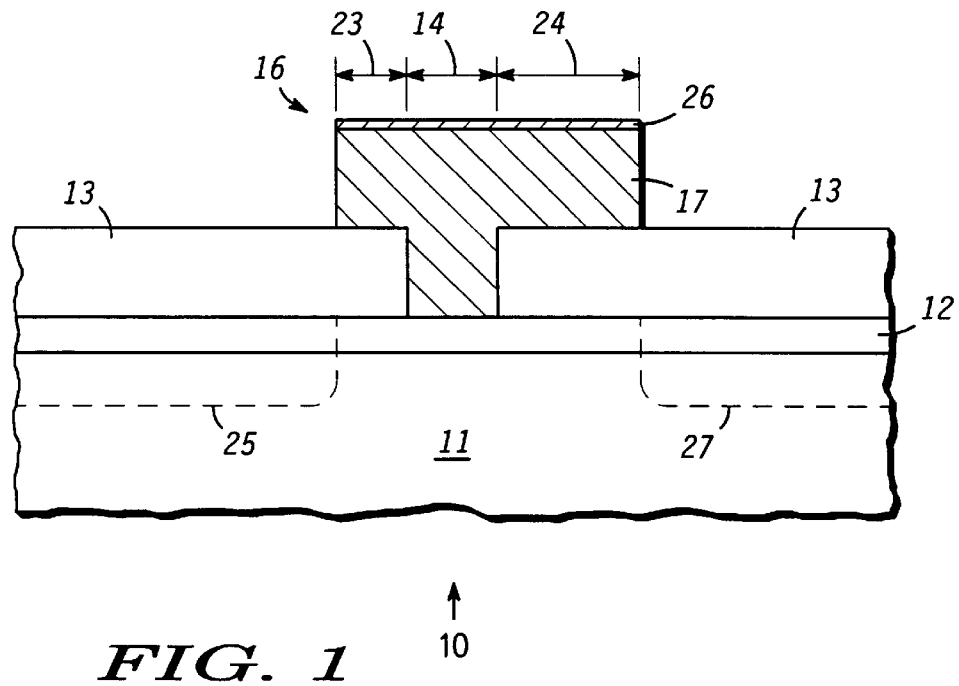
FIG. 1 illustrates an enlarged cross-sectional portion of a silicon carbide transistor at a stage of manufacturing in accordance with the present invention.

FIG. 1 illustrates an enlarged cross-sectional portion of a silicon carbide (SiC) metal semiconductor field effect transistor (MESFET) 10. Transistor 10 is formed on a SiC substrate 11 that typically is either high resistivity SiC or conducting SiC having a P-type epitaxial buffer layer on the conducting SiC. Substrate 11 also includes an N-type channel layer 12 that is epitaxially formed on a surface of substrate 11 by epitaxial techniques such as CVD that are well known to those skilled in the art. Layer 12 typically has a doping concentration of $1 \times 10^{16}$ to $5 \times 10^{17}$ atoms/cm$^3$. Transistor 10 has a gate 16 that is formed on the surface of substrate 11. Gate 16 is formed by applying a layer of a dielectric 13, such as silicon dioxide, to the surface of substrate 11. A gate footprint opening 14 is formed in dielectric 13 in order to expose a first portion of the surface of substrate 11. A gate material is applied onto the first portion of the surface of substrate 11 by filling opening 14 and applying the gate material to the surface of 13. The gate material can be any of a number of materials that form a Schottky contact with substrate 11 and typically is a gate metal such as LaB$_6$, platinum, gold, or titanium. A reflective cap or reflective layer 26 is applied to the gate material, and will subsequently be used to reflect energy used to anneal dopants in transistor 10, as will be seen hereinafter.

Gate 16 is patterned by applying a mask (not shown) covering the portion of the gate material that is to remain on dielectric 13, and removing exposed portions of the gate material. After patterning, gate 16 has a cross-member 17 that is supported by a base portion of gate 16 that is on the first portion of substrate 11. Subsequently, gate 16 will be used as a mask for implanting source and drain dopants into substrate 11, as will be seen hereinafter. For this subsequent implanting operation, cross-member 17 has a gate-to-source spacing or length 23 that determines the gate-to-source spacing of transistor 10, and a gate-to-drain spacing or length 24 that determines the gate-to-drain spacing of transistor 10, as will be seen hereinafter.

Figure 2:
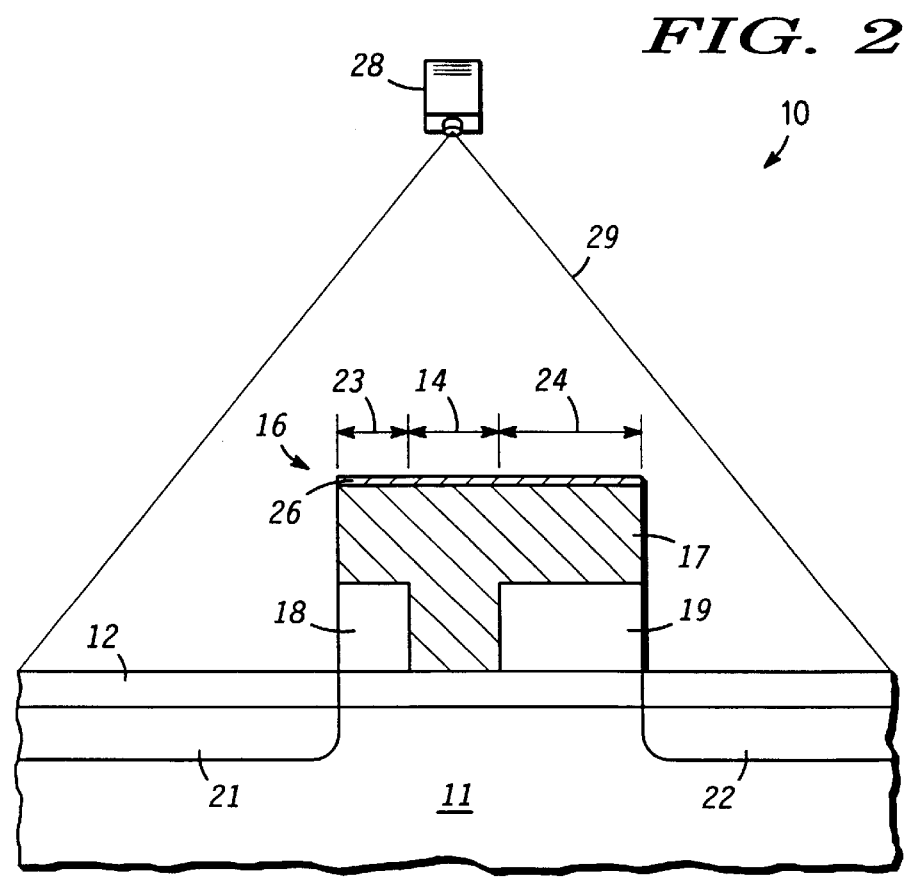
FIG. 2 illustrates an enlarged cross-sectional portion of the transistor of FIG. 1 at a subsequent manufacturing stage in accordance with the present invention.

FIG. 2 illustrates a subsequent stage in the formation of transistor 10 shown in FIG. 1. Elements of FIG. 2 that have the same reference numerals as FIG. 1 are the same as the corresponding FIG. 1 elements. After forming cross-member 17, gate 16 is used as a mask to remove portions of dielectric 13 that are not underlying cross-member 17. After the removal, a portion of dielectric 13 remains under cross-member 17 and forms a gate-to-source dielectric spacer 18 along a first edge of the portion of gate 16 in contact with substrate 11. Also, a gate-to-drain dielectric spacer 19 is formed by a portion of dielectric 13 (FIG. 1) that underlies the portion of cross-member 17 near drain 22. The removal operation also exposes a second portion of the surface of substrate 11.

Gate 16 is then utilized as a mask while implanting or positioning dopants into this second portion of the surface of substrate 11 in order to form a source 21 and drain 22 of transistor 10. The N-type dopants implanted to form source 21 and drain 22 generally are implanted at an energy of twenty to two hundred Kev and dosage of $2 \times 10^{13}$ to $2 \times 10^{15}$ atoms/cm$^2$. Because gate 16 and spacers 18 and 19 are used as a mask to form source 21 and drain 22, an edge of source 21 substantially aligns with an edge of spacer 18, and an edge of drain 22 substantially aligns with an edge of spacer 19.

Subsequently, the dopants are annealed by exposing transistor 10 to a laser beam 29 from a laser 28, for example, a 309 nanometer XeCl excimer laser. Generally, an energy fluence of less than approximately three J/cm$^2$ is utilized to anneal the dopants. The annealing usually produces a donor concentration of between $1 \times 10^{18}$ and $1 \times 10^{20}$ atoms/cm$^3$ in source 21 and drain 22. Exposed portions of transistor 10 absorb energy from laser beam 29 which locally heats those portions. Because gate 16 has a reflective layer 26, gate 16 does not absorb energy from laser beam 29, thus, gate 16 does not become sufficiently hot to cause deformation of gate 16 or to affect the Schottky contact formed at the interface of gate 16 and the surface of substrate 11. Consequently, gate 16 can be formed prior to annealing source 21 and drain 22 thereby allowing gate 16 or spacers 18 and 19 to be utilized as a mask for self-aligning source 21 and drain 22 to gate 16. Ambient temperatures are less than approximately six hundred degrees Celsius (600° C.) during annealing, and typically are between twenty degrees and six hundred degrees Celsius.

This self-alignment technique provides accurate control over source-to-gate spacing 23 and gate-to-drain spacing 24 of transistor 10. Because of the accurate control, gate-to-source spacing 23 can be minimized thereby decreasing the source resistance ($R_s$) of transistor 10 thereby resulting in higher gain. Because gate-to-drain spacing 24 can be accurately controlled, the gate-to-drain breakdown voltage can be accurately controlled thereby resulting in higher gate-to-drain breakdown voltage which results in higher output power and efficiency for transistor 10. In the preferred embodiment, gate-to-source spacing 23 is approximately 0.1 to 0.5 microns which results in at least twenty five percent higher transconductance and fifteen higher output power than prior MESFETs. Also in the preferred embodiment, gate-to-drain spacing 24 is approximately 0.5 to 2.0 microns.

Additionally, the portion of cross-member 17 on spacer 19 forms a field-plate that further increases the gate-to-drain breakdown voltage of transistor 10. Because length 24 is determined independently from length 23, the length of the portion of cross-member 17 between drain 22 and opening 14 results in a breakdown voltage that is approximately fifty percent greater than prior art MESFETs.

Referring back to FIG. 1, implants to form source 21 and drain 22 (FIG. 2) could be formed through dielectric 13, that is, prior to removal of dielectric 13 while still utilizing gate 16 as a mask as shown by a source dashed line 25 and a drain dashed line 27. Implanting through a dielectric layer is well known to those skilled in the art. Consequently, source 21 would be aligned to an edge of gate 16, and drain 22 would be aligned to an opposite edge of gate 16. After removing the portion of dielectric 13 above lines 25 and 27, annealing would subsequently be done as explained in the discussion of FIG. 2.

Figure 3:
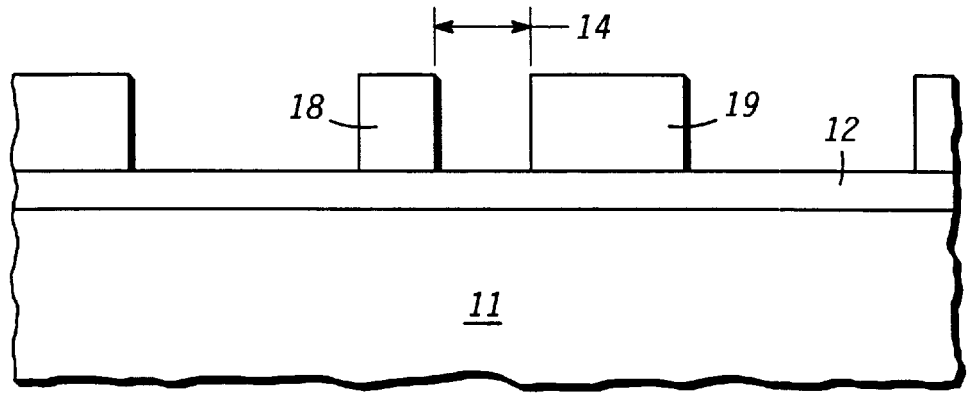
FIG. 3 illustrates an enlarged cross-sectional portion of an alternate embodiment of a silicon carbide transistor at a stage in manufacturing in accordance with the present invention.

FIG. 3 illustrates a silicon carbide transistor 30 that is an alternate embodiment of transistor 10 shown in FIG. 1 and FIG. 2. Elements of FIG. 3 that have the same reference numbers as FIG. 1 and FIG. 2 are the same as the correspondingly numbered elements in FIG. 1 and FIG. 2. Transistor 30 is formed by applying a layer of a dielectric 13 to substrate 11. Dielectric 13 is patterned to form gate footprint opening 14, as well as openings for source 21 and drain 22.

Figure 4:
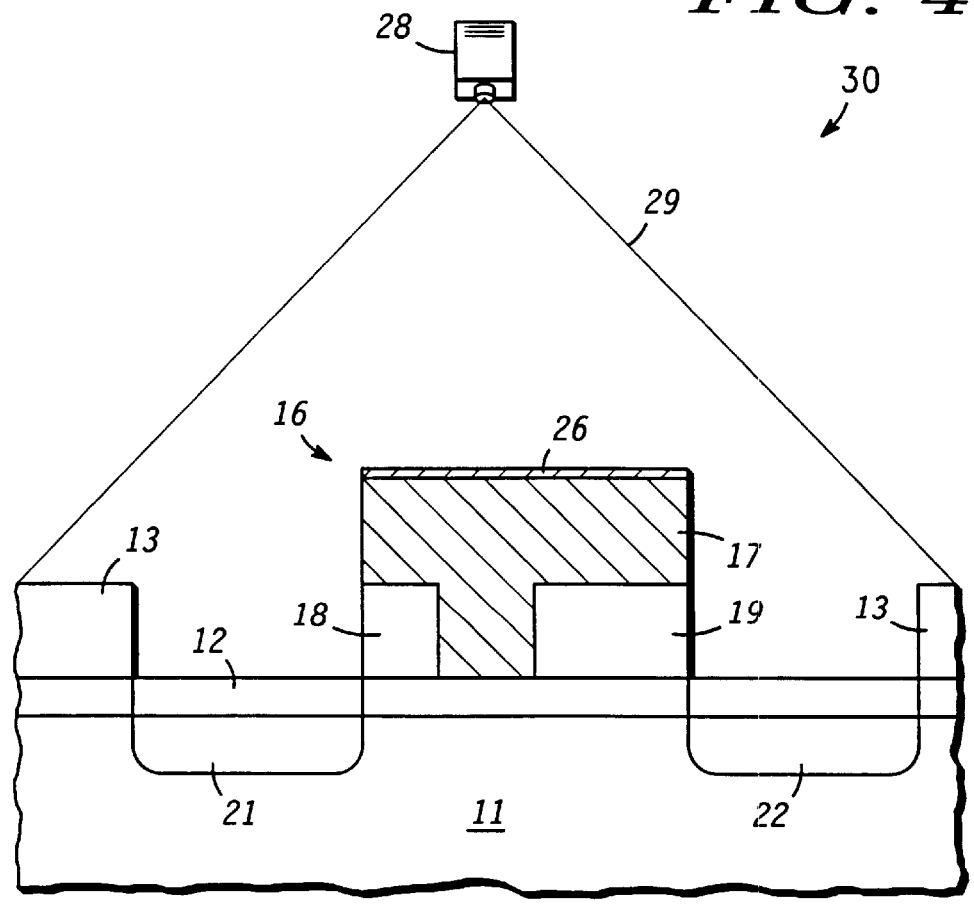
FIG. 4 illustrates an enlarged cross-sectional portion of the FIG. 3 transistor at a subsequent manufacturing stage in accordance with the present invention.

FIG. 4 illustrates a subsequent stage in the manufacture of transistor 30. Elements of FIG. 4 that have the same reference numbers as FIG. 3 are the same elements. A gate material is applied into gate footprint opening 14 (FIG. 3) and onto the surface of spacers 18 and 19. Subsequently, reflective layer 26 is applied to the gate material, and the gate material and layer 26 are patterned to form gate 16. Dopants are implanted to form source 21 and drain 22 using spacers 18 and 19 as a mask so that an edge of spacer 18 substantially aligns with an edge of source 21 and an edge of spacer 19 substantially aligns with an edge of drain 22. Thereafter, transistor 30 is annealed by laser beam 29 from laser 28 as described in the discussion of FIG. 2. Because gate 16 is formed subsequent to spacers 18 and 19, gate 16 typically is narrower than spacers 18 and 19.

Figure 5:
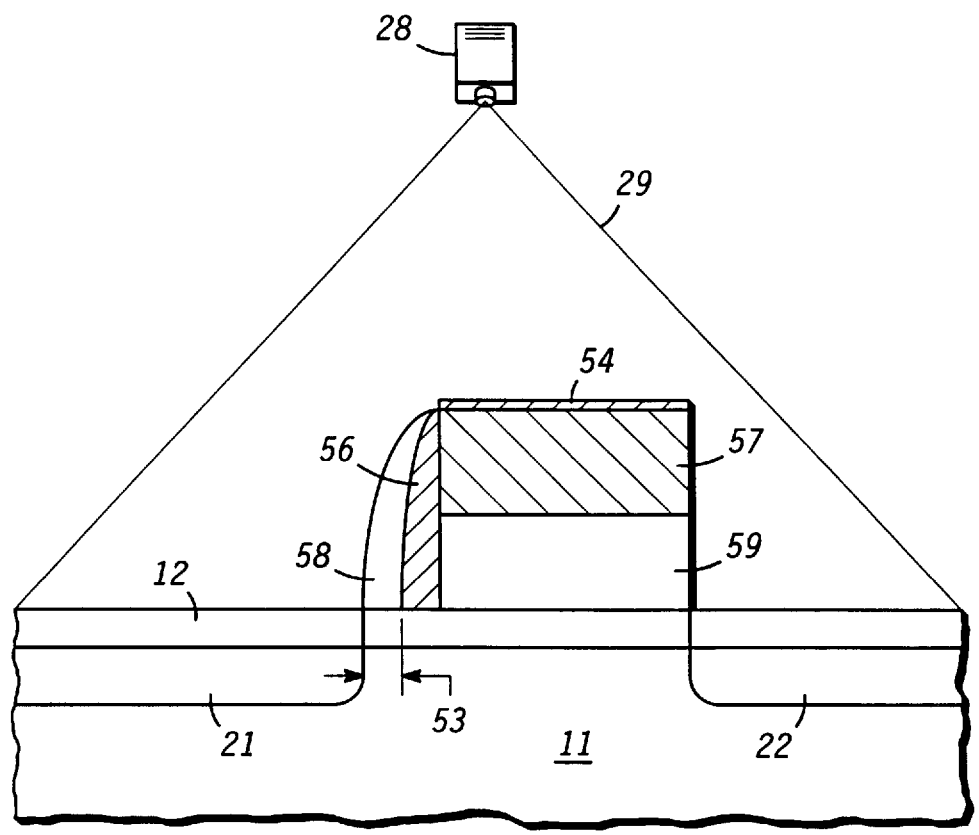
FIG. 5 illustrates an enlarged cross-sectional portion of another embodiment of a silicon carbide transistor at a stage in manufacturing in accordance with the present invention.

FIG. 5 illustrates an enlarged cross-sectional view of a SiC MESFET or transistor 50 that is an alternate embodiment of transistor 10 shown in FIG. 1 and FIG. 2. Elements of transistor 50 that have the same reference numerals as FIG. 1 and FIG. 2 are the same as the corresponding elements. Transistor 50 has a gate-to-drain dielectric spacer 59 that is formed on the surface of substrate 11. A conductor 57 is formed on spacer 59. A reflective layer 54, that is similar to layer 26 in FIG. 1, is formed on conductor 57. Typically, spacer 59, conductor 57, and layer 54 are formed by applying a dielectric layer across the surface of substrate 11, covering the dielectric layer with a conductor, and covering the conductor with a reflective layer. Thereafter, the multi-layer structure is patterned to form the resulting structure of spacer 59, conductor 57, and layer 54.

A gate material is formed on substrate 11 adjacent spacer 59 and extending up the sidewall of 59 to conductor 57 so that gate 56 forms electrical contact with conductor 57. Typically, gate 56 is formed by applying gate metal and etching away a portion of the gate metal leaving gate 56 extending up the sidewall of conductor 57 as is well known to those skilled in the art. Subsequently, a gate-to-source dielectric spacer 58 is applied to substrate 11 as a spacer and for covering the sidewall of gate 56 and extending up over the top of gate 56 to prevent exposure of gate 56. Spacer 58 has a width 53 that determines the gate-to-source spacing of transistor 50. Thereafter, source 21 and drain 22 are formed self-aligned to gate 56 utilizing spacers 58 and 59 as a mask so that source 21 is aligned to an edge of spacer 58 and drain 22 is aligned to an edge of spacer 59. Subsequently, transistor 50 is annealed by laser beam 29 as described in the discussion of FIG. 2.

By now it should be appreciated that there has been provided a novel way to fabricate a silicon carbide transistor. Utilizing a laser beam to anneal the implanted dopants facilitates annealing at low temperatures so that the gate material is not deformed and the Schottky contact between the gate and the substrate is not destroyed. The low temperature annealing allows forming the gate before source and drain implants thereby resulting in self-aligned structures with well controlled gate-to-source spacings that increase the frequency response of the transistor, and result in a MESFET that is more easily manufactured. Also, well controlled gate-to-drain spacings increase the breakdown voltage and efficiency of the transistor.

We claim:

1. A method of forming a silicon carbide transistor comprising:

forming a gate having a gate-to-source dielectric spacer along a first edge of the gate wherein the gate is on a silicon carbide substrate;

positioning a dopant within the substrate; and activating the dopant.

2. The method of claim 1 wherein activating the dopant includes activating the dopant at an ambient temperature of less than approximately 600° Celsius.

3. The method of claim 1 wherein activating the dopant includes exposing the silicon carbide transistor to a laser beam.

4. The method of claim 3 further including forming a reflective cap on the gate prior to exposing the silicon carbide transistor to the laser beam.

5. The method of claim 3 wherein exposing the silicon carbide transistor to the laser beam includes using an energy fluence less than approximately 3 J/cm$^2$.

6. The method of claim 1 wherein positioning the dopant within the substrate includes forming a source wherein an edge of the source substantially aligns with an edge of the gate-to-source dielectric spacer.

7. The method of claim 6 wherein forming the gate having the gate-to-source dielectric spacer along the first edge of the gate includes forming a gate-to-drain dielectric spacer on the substrate, forming a conductor layer on the gate-to-drain dielectric spacer, forming a gate metal on the substrate adjacent the gate-to-drain dielectric spacer and extending up a sidewall of the gate-to-drain dielectric spacer for making electrical contact with the conductor layer, and forming the gate-to-source dielectric spacer on the substrate adjacent the gate metal.

8. The method of claim 1 wherein positioning the dopant within the substrate includes forming a source on a surface of the substrate wherein an edge of the source substantially aligns with an edge of the gate.

9. The method of claim 8 wherein forming the gate having the gate-to-source dielectric spacer along the first edge of the gate includes forming a dielectric layer on the surface of the substrate, the dielectric layer having a surface; opening a gate footprint opening through the dielectric layer for exposing a first portion of the surface of the substrate; depositing a gate material into the gate footprint opening and onto the surface of the dielectric layer; removing a portion of the gate material to form a cross-member on the dielectric layer; and removing portions of the dielectric layer not underlying the cross-member thereby exposing a second portion of the surface of the substrate for forming the source wherein the edge of the source substantially aligns with an edge of the cross-member.

10. The method of claim 8 wherein forming the gate having the gate-to-source dielectric spacer along the first edge of the gate includes forming a dielectric layer on the surface of the substrate, the dielectric layer having a surface; opening a gate footprint opening through the dielectric layer for exposing a first portion of the surface of the substrate and a source opening through the dielectric layer for exposing a second portion of the surface of the substrate; and depositing a gate material into the gate footprint opening and onto the surface of the dielectric layer adjacent the gate footprint opening to form a cross-member on the dielectric layer wherein the edge of the source substantially aligns with an edge of the cross-member.

11. The method of claim 10 wherein the step of forming the gate having the cross-member includes forming the cross-member with a gate-to-drain length that is longer than a gate-to-source length.

12. A method of forming a silicon carbide MESFET comprising:
providing a silicon carbide substrate having a surface;
forming a dielectric layer on the surface of the substrate, the dielectric layer having a surface;
opening a gate footprint opening through the dielectric layer and exposing a first portion of the surface of the substrate;
forming a gate having a cross-member on the surface of the dielectric layer and a base portion that is in the gate footprint opening and on the first portion of the surface of the substrate;
positioning a dopant within the substrate to form a source wherein an edge of the source substantially aligns with a first edge of the cross-member; and
activating the dopant at an ambient temperature of less than approximately 600° Celsius.

13. The method of claim 12 further including activating the dopant by exposing the silicon carbide MESFET to a laser beam.

14. The method of claim 13 further including forming a reflective cap on the cross-member prior to exposing the silicon carbide MESFET to the laser beam.

15. The method of claim 13 wherein exposing the silicon carbide MESFET to the laser beam includes using an energy fluence less than approximately 3 $J/cm^2$.

16. The method of claim 12 wherein forming the gate having the cross member includes depositing a gate material into the gate footprint opening and onto the surface of the dielectric layer, removing a portion of the gate material to form the cross-member on the dielectric layer, and removing portions of the dielectric layer not underlying the cross-member thereby exposing a second portion of the surface of the substrate.

17. The method of claim 12 further including implanting the dopant into a drain area of the silicon carbide MESFET wherein the drain area has an edge substantially aligned with a second edge of the cross-member.

18. The method of claim 12 wherein the step of forming the gate having the cross-member includes forming the cross-member with a gate-to-drain length that is longer than a gate-to-source length.

* * * * *